United States Patent [19]
Bhatt et al.

[11] Patent Number: 5,557,844
[45] Date of Patent: Sep. 24, 1996

[54] METHOD OF PREPARING A PRINTED CIRCUIT BOARD

[75] Inventors: Anilkumar C. Bhatt, Johnson City; Roy H. Magnuson, Endicott; Voya R. Markovich, Endwell; Konstantinos I. Papathomas; Douglas O. Powell, both of Endicott, all of N.Y.

[73] Assignee: International Business Machines Corporation, Armonk, N.Y.

[21] Appl. No.: 463,344

[22] Filed: Jun. 5, 1995

Related U.S. Application Data

[62] Division of Ser. No. 342,533, Nov. 21, 1994.

[51] Int. Cl.⁶ .................................................. H01K 3/10
[52] U.S. Cl. .......................... 29/852; 29/830; 156/89; 174/266; 427/97
[58] Field of Search ............... 29/830, 852; 174/266; 427/97; 156/89

[56] References Cited

U.S. PATENT DOCUMENTS

| 3,813,773 | 6/1974 | Pouks | 29/830 |
|---|---|---|---|
| 5,261,154 | 11/1993 | Ferrier et al. | 29/830 |
| 5,322,593 | 6/1994 | Hasegawa et al. | 29/830 X |
| 5,329,695 | 7/1994 | Traskos et al. | 29/830 |
| 5,337,466 | 8/1994 | Ishida | 29/830 |
| 5,426,849 | 6/1995 | Kimbara et al. | 29/830 |
| 5,440,805 | 8/1995 | Daigle et al. | 29/830 |

*Primary Examiner*—Carl J. Arbes
*Attorney, Agent, or Firm*—Richard M. Goldman

[57] ABSTRACT

Disclosed is a printed circuit board and a method of preparing the printed circuit board, The printed circuit board has two types of plated through holes. The first type of plated through holes extend to and through an exterior surface of the printed circuit board for receipt of a pin-in-through-hole module or component pin. The second type of plated through holes are for surface mount technology and terminate below the exterior surface of the printed circuit board. These plated through holes contain a fill composition.

1 Claim, 1 Drawing Sheet

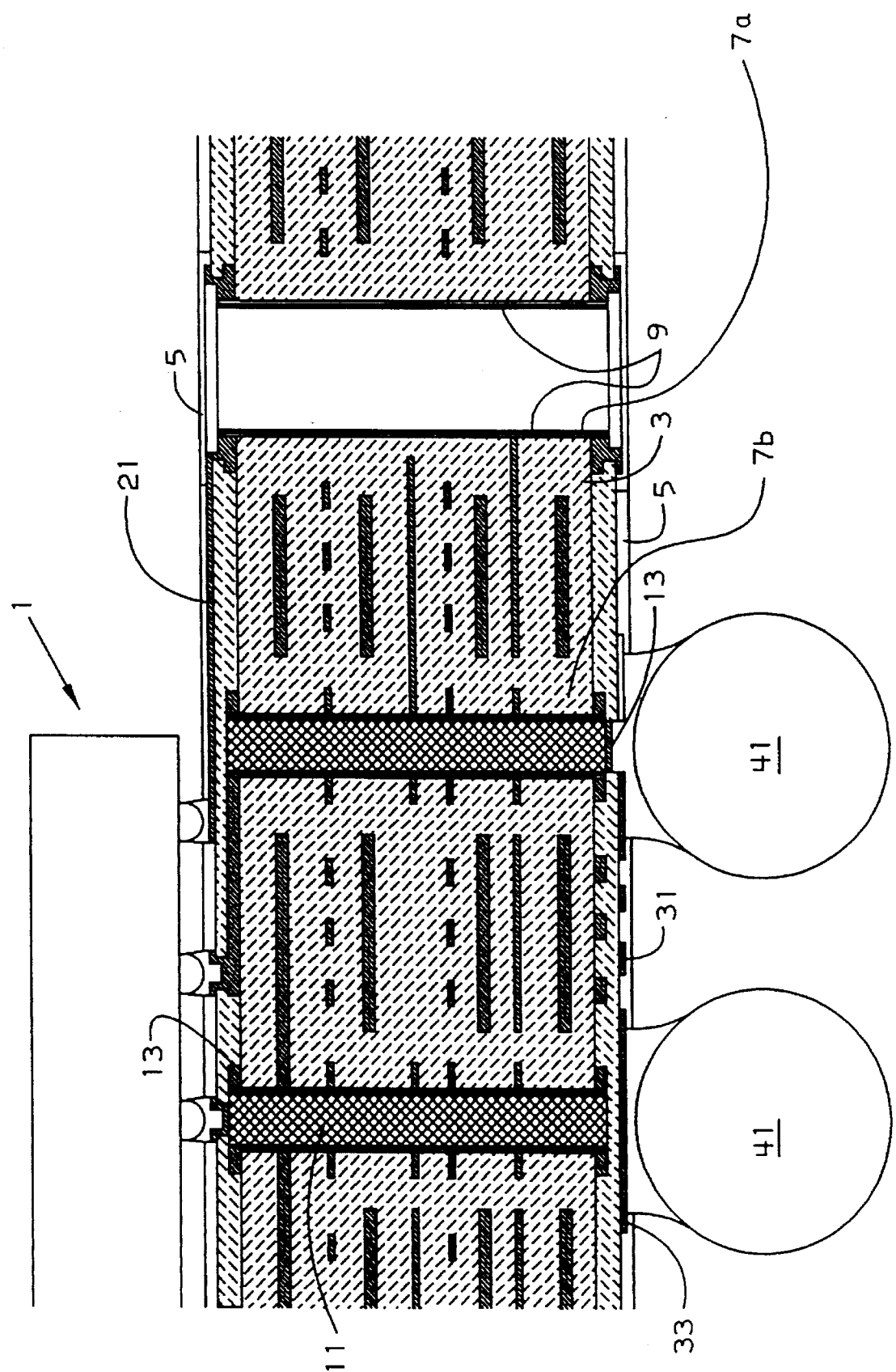

METHOD OF PREPARING A PRINTED CIRCUIT BOARD

This is a divisional of copending application Ser. No. 08/342,533 filed on Nov. 21, 1994.

FIELD OF THE INVENTION

This invention relates to printed circuit boards and method of fabricating them. The printed circuit boards have high circuit and component density, including either or both of surface mount components or additional circuitry layers directly atop plated through holes. The printed circuit boards of the invention are especially useful where the density of plated through holes required to service the I/O's of the surface mount devices is such that there is no surface area available for attachment pads interstitial to the plated through hole grid. The printed circuit boards of the invention are useful with fine pitch Ball Grid Array (BGA) integrated circuit modules and flip chip attach integrated circuit chips.

The printed circuit boards are prepared by first laminating a subcomposite with exterior sheets. Then a first pattern of holes are drilled through the subcomposite for plated through holes. This is followed by plating over the exposed surfaces of the subcomposite and the plated through hole barrels to form plated through holes. Fill material is forced through the drilled exterior sheets and into the plated through hole to fill the plated through holes with plated through hole filler composition. The subcomposite is then drilled to form a second pattern of through holes that are to remain unfilled. The through holes of this second pattern are plated, and a desired circuit pattern of surface circuitization is formed.

BACKGROUND OF THE INVENTION

Increasing levels of integration of integrated circuit chips reduces the chip count of a functional circuit, while significantly increasing the I/O count of the individual integrated circuits making up the functional circuit. This drive for increased circuit and component density in the individual integrated circuit chips leads to a parallel drive for increased circuit and component density in the printed circuit boards carrying the chips and in the assemblies using them.

The increased circuit and component density in the printed circuit boards makes the ability to locate either solder surface mount components or place additional circuitry layers directly above plated through holes highly desirable. This is especially the case when the density of the plated through holes required to service the I/O's of the surface mount components is such that there is no surface area available for attachment pads interstitial to the plated through hole grid.

The problem is especially severe with fine pitch ball grid array components (BGA) and flip chip attach integrated circuits. Soldering of these surface mount components to the surface pads, i.e., lands, of conventional plated through holes is highly undesirable. This is because the solder used for assembly tends to wick down into the plated through holes. The result is low volume, unreliable solder joints.

One solution that has been proposed is filling the plated through holes. However, known methods of filling plated through holes of printed circuit boards have deficiencies. For example, they suffer from bleed of the resin component of the PTH fill material along the surface of the boards. This resin also bleeds into holes which are not to be filled. This leads to short circuits and to soldering defects during assembly.

OBJECTS OF THE INVENTION

It is a primary object of the invention to facilitate the connection of high I/O density integrated circuit chips to highly packed printed circuit boards and cards.

It is a further object of the invention to provide for high interconnection escape.

It is a still further object of the invention to provide a process to make high function density printed circuit boards having selectively filled through holes.

SUMMARY OF THE INVENTION

These and other objects of the invention are achieved by the printed circuit board of our invention. The printed circuit board is one having two types of plated through holes. The first type of plated through holes extend to and through an exterior surface of the printed circuit board for receipt of a pin-in-through-hole module or component. The second type of plated through holes terminate at or below the exterior surface of the printed circuit board and allow for further surface circuitization as well as surface mount attachment. These plated through holes contain a fill composition, for example, an electrically or thermally conductive fill composition.

According to a further embodiment of our invention there is provided one or more plated through hole that terminate in a surface mount contact. Typically the plated through holes that terminate in a surface mount contact have a conductive cap bonded to the surface mount contact.

According to a still further embodiment of our invention there is provided at least one of the plated through holes terminating at a layer of dielectric material; that is, extending to but not through the layer of dielectric material. This allows external circuitization on the dielectric that overlays the plated through hole.

According to our invention the filler is a composition of an organic polymeric material, optionally with a particulate filler added thereto to modify the thermal or electrical conductivity or the coefficient of thermal expansion. In at least one of the second plurality of plated through holes the filler composition may be a thermally or electrically conductive fill composition. The filler composition is compounded to have a coefficient of thermal expansion matched to the coefficient of thermal expansion of the printed circuit board substrate. The fill composition includes as components a resin, also referred to herein as a binder, and a particulate, conductive or non-conductive filler component.

THE FIGURES

The invention may be understood by reference to the FIGURE appended hereto.

FIG. 1 is a cutaway side elevation of a printed circuit board of the invention.

DETAILED DESCRIPTION OF THE INVENTION

According to our invention there is provided a printed circuit board having two types of plated through holes. The first type of plated through holes extend to and through an exterior surface of the printed circuit board for receipt of a pin-in-through-hole module or component. The second type of plated through holes are filled plated through holes. These filled plated through holes terminate below the exterior surface of the printed circuit board, for example, below or adjacent to pads or lands, or below external circuitization. These plated through holes contain a fill composition, for example, a thermally and/or electrically conductive fill composition. These filled plated through are adapted to receive a surface mount component having a contact such as controlled collapse chip connection contact, including a controlled collapse chip connection contact surrounded by an encapsulant. The surface mount contacts are typically a plurality of surface mount contacts, and the plurality of surface mount contacts are adapted to receive area array contacts. Alternatively, the surface mount contact is adapted to receive a wire lead bond.

A typical printed circuit board 1 of the invention is shown in FIG. 1. The printed circuit board 1 shown in FIG. 1 has a subcomposite 3 and a film redistribution layer 5. Extending through the subcomposite 3 are plated through holes 7a and 7b. Each of the plated through holes 7a and 7b has plated barrels 9. Plated through hole 7a is unfilled, and is for insertion of a pin-in-through-hole component (not shown). Plated through hole 7b is filled with fill composition 11, and extends through the subcomposite 3 up to the optional film redistribution layer 5, when present, where it terminates in a conductive copper cap 13. The subcomposite has external circuitization 21, buried beneath the film redistribution layer 5, as well as internal power and signal lines.

The optional film redistribution layer 5, when present, formed of a photoimagable dielectric has surface circuitization 31, including pads 33. Pads 33 are for mounting surface mount devices, e.g., integrated circuit chips with solder balls 41.

According to our invention there is provided one or more plated through holes that terminate in a surface mount contact, as plated through hole 7b in FIG. 1. Typically the plated through holes that terminate in a surface mount contact can have a conductive cap atop the plated through hole and bonded to the surface mount contact, as a land or a pad.

According to a still further embodiment of our invention there is provided at least one of the plated through holes terminating at a layer of dielectric material. That is, the plated through hole extends to but not through the layer of dielectric. This allows external circuitization on the dielectric that overlays the plated through hole.

According to our invention the filler in at least one of the second plurality of plated through holes may be a conductive filler. The filler composition is compounded to have a coefficient of thermal expansion after cure more closely matched to the coefficient of thermal expansion of the printed circuit board substrate then that of the unfilled resin. Typical cured organic substrate materials have a coefficient of thermal expansion of from about 10 ppm/degree C. to about 28 ppm/degree C. Thus the coefficient of thermal expansion of the cured fill composition, for example, the cured conductive fill composition, can be from about 17 ppm/degree C. to about 45 ppm/degree C. and preferably from about 25 ppm/degree C. to about 40 ppm/degree C.

Moreover, the fill composition, including both the filler resin or binder, and the filler particles, when present, should be chemically compatible with the printed circuit board fabrication processes and chemistry, including plating and etching processes and chemistries. The fill composition should also have good adhesion and plating properties. Additionally, the fluid properties of the compounded, but uncured, fill material, that is the viscosity and surface tension, among other properties, should allow sufficient flow to fill and coat small, high aspect ratio plated through hole barrels.

One particularly desired property of the fill composition constituents is the property of minimal volumetric change on solidification.

These and other desirable attributes and properties are attained in fill compositions that includes thermosetting resins filled with suitable patriculates or powders. Especially useful resins are epoxy resins of the same type used to make epoxy/glass pre-pregs used for printed circuit board construction, and filled with suitable particulates, for example metallic particulates. Exemplary are silver or copper particles.

The blended fill composition contains approximately 30 to 90 weight percent of a particulate, balance organics, as a catalyst and a binder, also referred to herein as a resin. Specifically, the binder or resin composition is either an epoxy composition, a cyanate composition, or combinations thereof. The epoxy composition is comprised of epoxy resin, curing agent, particulate filler, and catalyst. The epoxy resin is either a cycloaliphatic epoxy resin or an epoxy cresol novolac resin. Depending on the epoxy resin used additional components are also employed.

The particulate component of the blended filler composition, when present in the composition, can be one or more of carbon powders, organics, and metallic powders, such as copper, silver, nickel, molybdenum, gold, palladium, platinum, aluminum powder and mixtures thereof, having an average particle size of 0.1 to 75 microns, preferably 0.5 microns to 25 microns, more preferably about 0.5 to about 10 microns. Suitable copper powders are commercially available from Alcan Powders & Pigments or Metz Metallurgical Corporation. Optionally, electrically insulating powders such as aluminum oxide, 92% alumina, 96% alumina, aluminum nitride, silicon nitride, silicon carbide, beryllium oxide, boron nitride, silicas, silicates, and diamond powder may be added to the blend.

As used herein "binder" and "resin" mean the nonparticulate, nonsolvent, organic components of the fill composition.

An important feature of the invention is the process for selectively mass filling the plated through holes. In this process the fill composition is coated as a thin layer, for example from about 0.5 mil to about 6 mils thick, on a carrier film or foil. This thin layer is dried and/or partially cured to form an easy to handle, tack free carrier.

Meanwhile, the composite, multilayer printed circuit board, with copper foil on its external surfaces is conventionally drilled with the pattern of plated through holes intended to be filled. A masking film is also prepared with the same pattern as the plated through holes to be filled. The drilled holes in the printed circuit board are conventionally activated and plated with metal. Thereafter, the masking film is aligned with the printed circuit board, that is, the holes in the masking sheet are aligned with the drilled and activated plated through holes in the printed circuit board.

The coated carrier, coated with fill material, is placed over the printed circuit board and masking sheet. The coated carrier, the masking film, and the printed circuit board are laminated in, for example, a vacuum laminating press. The press cycle of the vacuum laminating press is activated, which results in air being removed from the stack of the coated carrier, the masking film, and the printed circuit board. The heat causes the fill material to flow through the holes in the masking film or foil into the plated through holes under the force of the applied pressure.

The stack is then removed from the laminating press, and the mask and carrier sheets are peeled away. Additional processing is, however, required to make the printed circuit board ready for circuitization. For example, the plated through hole fill process has raised nubs of fill material at each of the plated through holes, and some of the fill material may have bled between the mask sheet and the printed circuit board. The nubs and surface film of cured fill material must be removed before circuitization. This can be accomplished by surface abrasion, or by well known printed circuit board chemical hole clean processes which chemically remove cured epoxies.

In order to facilitate electrical connection as well as the formation of a solder cap atop the filled plated through holes, the printed circuit board panel is overplated with a thin layer of metal, such as copper. The copper overplate provides electrical conductivity for additive circuitization and solderability. The printed circuit board panel, with filled, plated through holes can now be circuitized.

Where it is desired to have both filled plated through holes and unfilled plated through holes, the through holes intended to be filled are prepared first, substantially as described above. Thereafter, the through holes not intended to be filled are drilled. This results in selectively filled through holes. The drilling process is carried out after filling the plated through holes intended to be filled, and either before or after the nub and bleed removal processes. The processes used for overplating the filled plated through holes can then be used to also plate the barrels of the unfilled through holes.

Where it is desired to provide a film redistribution layer atop a circuitized printed circuit board, only a thin layer of plating is applied atop the unfilled plated through holes, for example, about 0.0001 to 0.0010 inch of Cu. The resulting sub-composite is circuitized using known print and etch methods. Thereafter a photoimageable dielectric is applied atop the circuitized sub-composite. The photoimageable dielectric is photoprocessed to form vias to the underlying subcomposite. The vias are formed above filled through holes and also where connectivity is desired between the sub-composite circuitization and the circuitization to be formed on the surface of the photoimageable dielectric. Blind vias may be formed above filled through holes and other circuit features on the subcomposite. Photovias should be formed concentric to and larger than unfilled through holes. Photo vias may also be formed above filled through holes where this is desired as part of the circuitization. The surface of the photoimagable dielectric can then be treated to improve the adhesion of the circuitry to be formed thereon. The surface of the photoimagable dielectric is activated and circuitized. Circuitization can be accomplished by full panel plating and subtractive etching, pattern electroplating, or pattern electrolessplating. In all of these methods the barrels of the unfilled plated through holes, which had only a thin layer of metal plated on them previously, are again plated so that the combined thickness of the two plating steps is sufficient for plated through hole conductivity.

EXAMPLE

This example illustrates a method of preparing a printed circuit board having a film redistribution layer and selective filled plated through holes. The method includes the steps of:

a. Laminating a subcomposite with exterior sheets.

b. Drilling a first pattern of holes through the subcomposite for plated through holes.

c. Plating over the exposed surfaces of the subcomposite and the plated through hole barrels.

d. Forcing fill material through the drilled exterior sheets and into the plated through hole to fill the plated through holes.

e. Drilling the subcomposite with a second pattern of through holes that are to remain unfilled;

f. Plating the second pattern of through holes.

g. This is followed by forming a desired circuit pattern of surface circuitization.

According to one embodiment of the invention a composition is prepared containing approximately 70 to 80 weight percent of Cu powder having a maximum particle size of 6 micrometers, and approximately 20 to 30 weight percent phenol cured cresol-novolac resin, with sufficient methyl ethyl ketone solvent to achieve a suitable viscosity for coating. A tertiary amine catalyst is added to the composition. The composition is then coated onto a 1 ounce/square foot Cu foil. The coated Cu foil is heated to remove solvent and to provide a tack free surface with a dried coating thickness of about 0.002 to 0.006 inch.

A printed circuit board subcomposite is laminated with 0.5 ounce/square foot Cu foil on both sides, and vapor grit blasted to remove epoxy residue from the lamination process. The laminated Cu foil is then thinned by etching to about 0.00025 inch. Holes for the plated through holes are drilled, and a sheet of polyimide is drilled with the same plated through hole pattern. Meanwhile, the drilled subcomposite is deburred and chemically hole cleaned to prepare the through hole barrels for plating. The sub-composite is seeded with a palladium/tin colloidal suspension. This palladium/tin seed plating makes the exposed surfaces catalytic for electroless Cu plating. Copper is electrolessly plated over the exposed surfaces and in the plated through hole barrels to a thickness of about 0.001 to 0.0012 inch.

After plating, the drilled polyimide sheet is placed on the sub-composite and aligned with the plated through holes. The sheet of epoxy-Cu coated foil is placed atop the sub-composite. The resulting stack is placed in a vacuum laminating press, a vacuum pulled, and heat and pressure applied. The heat and pressure cause the coating composition of epoxy and Cu to soften and flow through the holes in the drilled polyimide into the plated through holes. Heating is continued to cause the epoxy in the through holes to cure. The laminator is then cooled, the pressure released, and the filled sub-composite is removed from the laminator.

After removing the sub-composite, the surface thereof is mechanically abraded to remove nubs of the epoxy-Cu fill material from the tops of the filled plated through holes, as well as to remove any epoxy residues on the surface of the copper due to bleed between the polyimide mask and the sub-composite.

Next, the subcomposite is drilled with the pattern of plated through holes that are to remain unfilled. This is followed by a mechanical deburring operation and a chemical hole cleaning operation to prepare the unfilled plated through hole barrels for plating. The subcomposite is again seeded with a palladium/tin colloidal suspension, and electrolessly copper plated with an additional 0.0002 to 0.0003 inch of copper. The subcomposite is pumice scrubbed, and a layer of photoresist is applied, exposed, and developed to define a desired pattern for subtractive surface circuitization of the subcomposite.

The exposed surface of the subcomposite is etched in cupric chloride to form the desired circuit pattern. The thickness of the copper etched is about 0.0014 to 0.0018 inch, which facilitates etching of fine lines and spaces. Thereafter the photoresist is stripped.

The subcomposite is then processed through a sequence of chloriting steps to enhance adhesion of a photoimagable dielectric layer. After chloriting, a dry film photoimagable, dielectric polymer, about 0.0020 to 0.0040 inch thick, is applied and adhered to the one or both surfaces of the subcomposite. Adhesion can be by vacuum lamination. This photoimagable dielectric is then exposed with the pattern of the desired vias between the subcomposite circuitry and the circuitry to be formed on the top surface of the dielectric. The via openings are developed, and the dielectric is exposed and heated to further cure the dielectric.

The surface of the cured, photoimaged dielectric may then be vapor blasted and subjected to a chemical hole clean process to enhance the adhesion of subsequent circuitization thereon.

The dielectric is seeded with colloidal palladium/tin, and a subsequent dry film photoresist layer is laminated thereto, over the palladium/tin seed layer. The photoresist is then imaged with the image of the circuitization to be formed, and developed.

The seeded composite with imaged photoresist is placed in an electroless copper plating bath for a time sufficient to plate copper to a thickness of 0.0007 to 0.0010 inch. This results in the formation of a top surface circuitization layer and a blind via interconnection. Plating also occurs in unfilled plated through holes having access to the surface to a final barrel thickness of about 0.0010 to 0.0013 inch.

After additive circuitization, the photomask is chemically stripped, and the surface cleaned. Composite circuitization is complete. Gold, or tin-lead features or solder masks can be applied to the circuitized composite with a film redistribution layer.

While the invention has been described with respect to certain preferred embodiments and exemplifications, it is not intended to limit the scope of the invention thereby, but solely by the claims appended hereto.

We claim:

1. A method of preparing a printed circuit board having a film redistribution layer and selective filled plated through holes comprising the steps of:

a. laminating a printed circuit board subcomposite with 0.5 ounce/square foot Cu foil on both sides thereof;

b. thinning the copper foil to about 0.00025 inch;

c. drilling a pattern of holes through the subcomposite for plated through holes, and drilling a sheet of polyimide with the same plated through hole pattern;

d. seeding the drilled subcomposite with a palladium/tin colloidal suspension whereby to make the exposed surfaces catalytic for electroless Cu plating;

e. electrolessly plating copper over the exposed surfaces of the subcomposite and in the plated through hole barrels to a thickness of about 0.001 to 0.0012 inch;

f. positioning the drilled polyimide sheet on the subcomposite aligned with the plated through holes;

g. placing a sheet of foil coated with plated through hole filler composition atop the sub-composite to form a stack;

h. laminating the stack to cause the coating composition to soften and flow through the holes in the drilled polyimide into the plated through holes and thereafter cure;

i. abrading the surface thereof to remove nubs of the fill material from the tops of the filled plated through holes, and remove fill residues on the surface of the copper foil from bleed between the mask and the sub-composite;

j. drilling the subcomposite with the pattern of plated through holes that are to remain unfilled, deburring, and chemical hole cleaning the unfilled plated through hole barrels for plating;

k. seeding the subcomposite with a palladium/tin colloidal suspension, and electrolessly copper plating the seeded subcomposite with an additional 0.0002 to 0.0003 inch of copper;

l. applying a layer of photoresist to the subcomposite, and exposing and developing the layer of photoresist to define a desired pattern of surface circuitization;

m. etching the exposed surface of the subcomposite to form a desired circuit pattern;

n. stripping the photoresist;

o. applying a dry film photoimagable, dielectric polymer, to one or both surfaces of the subcomposite;

p. exposing the photoimagable dielectric with the pattern of the desired vias between the subcomposite circuitry and the circuitry to be formed on the top surface of the dielectric;

q. developing the pattern of via openings, and thereafter processing the dielectric to further cure the dielectric;

r. seeding the dielectric with a colloidal palladium/tin suspension;

s. laminating a subsequent dry film photoresist layer thereto, over the palladium/tin seed layer; imaging the photoresist with the image of the circuitization to be formed, and developing the imaged photoresist;

t. plating the subcomposite with copper to form a film redistribution layer thereon;

u. stripping the photomask from the circuitized composite.

* * * * *